US006940636B2

(12) United States Patent
Felton

(10) Patent No.: US 6,940,636 B2
(45) Date of Patent: Sep. 6, 2005

(54) OPTICAL SWITCHING APPARATUS AND METHOD OF ASSEMBLING SAME

(75) Inventor: Lawrence E. Felton, Hopkinton, MA (US)

(73) Assignee: Analog Devices, Inc., Norwood, MA (US)

( * ) Notice: Subject to any disclaimer, the term of this patent is extended or adjusted under 35 U.S.C. 154(b) by 270 days.

(21) Appl. No.: 09/957,117

(22) Filed: Sep. 20, 2001

(65) Prior Publication Data

US 2003/0053233 A1 Mar. 20, 2003

(51) Int. Cl.[7] .............................. G02B 26/08; G02F 1/29
(52) U.S. Cl. ....................... 359/298; 359/290; 359/291
(58) Field of Search ................................ 359/298, 290, 359/291, 292, 578, 109, 196, 197, 212, 214, 317, 318, 398, 117, 128, 147, 139, 193

(56) References Cited

U.S. PATENT DOCUMENTS

| | | | |
|---|---|---|---|
| 4,786,357 A | 11/1988 | Campanelli et al. ........ 156/633 |
| 4,809,901 A * | 3/1989 | Gen et al. .................. 228/56.3 |
| 5,173,392 A | 12/1992 | Miersch et al. ............. 430/311 |
| 5,323,051 A | 6/1994 | Adams et al. .............. 257/417 |
| 5,535,526 A * | 7/1996 | White ............................ 34/78 |
| 5,594,979 A | 1/1997 | Borchelt et al. ........... 29/25.35 |
| 5,604,160 A | 2/1997 | Warfield ..................... 437/209 |
| 5,761,350 A | 6/1998 | Koh ............................. 385/14 |
| 5,798,557 A | 8/1998 | Salatino et al. ............. 257/416 |
| 5,824,177 A | 10/1998 | Yoshihara et al. .......... 156/250 |
| 5,915,168 A | 6/1999 | Salatino et al. ............. 438/110 |
| 6,297,072 B1 | 10/2001 | Tilmans et al. ............. 438/106 |
| 6,327,407 B1 * | 12/2001 | Mitsuda et al. ............... 385/49 |
| 6,373,620 B1 * | 4/2002 | Wang ......................... 359/315 |
| 6,516,671 B2 | 2/2003 | Romo et al. .................. 73/718 |
| 6,543,286 B2 * | 4/2003 | Garverick et al. ........ 73/514.18 |
| 6,555,417 B2 | 4/2003 | Spooner et al. ............. 438/113 |
| 6,587,626 B2 | 7/2003 | Beguin et al. .............. 385/125 |
| 6,620,642 B2 * | 9/2003 | Dudoff et al. ................ 438/26 |
| 6,706,546 B2 | 3/2004 | Yoshimura et al. ........... 438/31 |
| 2002/0021055 A1 | 2/2002 | Lee et al. .................... 310/309 |
| 2002/0027294 A1 * | 3/2002 | Neuhaus et al. ............ 257/778 |
| 2002/0045030 A1 | 4/2002 | Ozin et al. .................. 428/173 |
| 2002/0054422 A1 * | 5/2002 | Carr et al. .................. 359/291 |
| 2002/0088988 A1 | 7/2002 | Silverbrook ................. 257/99 |
| 2002/0090180 A1 | 7/2002 | Silverbrook ................. 385/92 |
| 2002/0109894 A1 | 8/2002 | Clark et al. ................. 359/224 |
| 2003/0053233 A1 | 3/2003 | Felton ........................ 359/883 |
| 2003/0092229 A1 | 5/2003 | Silverbrook ................ 438/200 |
| 2003/0113067 A1 | 6/2003 | Koh ............................. 385/48 |
| 2003/0119278 A1 | 6/2003 | McKinnell .................. 438/455 |

FOREIGN PATENT DOCUMENTS

| | | | | |
|---|---|---|---|---|
| JP | 2001144117 A | 5/2001 | ........... H01L/21/56 |
| JP | 2001269900 A | 10/2001 | ............. B81C/1/00 |

OTHER PUBLICATIONS

Smith et al., Micromachined Packaging for Chemical Microsensors, IEEE Trans, Electron Devices, Jun. 1988, vol. 35, No. 6, pp. 192–197.

(Continued)

Primary Examiner—Ricky L. Mack
Assistant Examiner—Brandi Thomas
(74) Attorney, Agent, or Firm—Bromberg & Sunstein LLP

(57) ABSTRACT

In an optical switching apparatus having a mirror structure bonded to a substrate, the gap between the mirror structure and the substrate is controlled by mechanical standoffs placed between the mirror structure and the substrate. The mirror structure is bonded to the substrate using solder. The mechanical standoffs are formed from a material having a higher melting point than that of the solder. The mirror structure is bonded to the substrate under pressure at a temperature between the melting point of the solder and the melting point of the mechanical standoffs.

15 Claims, 3 Drawing Sheets

OTHER PUBLICATIONS

Petersen et al., Silicon Fusion Bonding for Pressure Sensors, Rec. of the IEEE Solid–State Sensor and Actuator Workshop, 1988, pp. 209–212.

Rudolf et al., Silicon Microaccelerometer, Transducers' 87, Rec. of the $4^{th}$ Int. Conf. on Solid–State Sensors and Actuators, 1987, pp. 376–379.

Ko et al., Bonding Techniques for Microsensors, Micromachining and Micropackaging of Transducers, 1985, pp. 198–208.

Roylance et al., A Batch–Fabricated Silicon Accelerometer, IEEE Trans. Electron Devices, Dec. 1979, vol. ED–26, No. 12, pp. 352–358.

Yoshio Awatani et al., Damage Free Dicing Method for MEMS Devices, International Conference on Opical MEMs Conference Digest, pp. 137–138, Aug. 20–23, 2002.

Lee et al., Fabrication of Silicon Optical Scanner for Laser Display; 2000, pp. 13–14.

* cited by examiner

FIG. 2  200
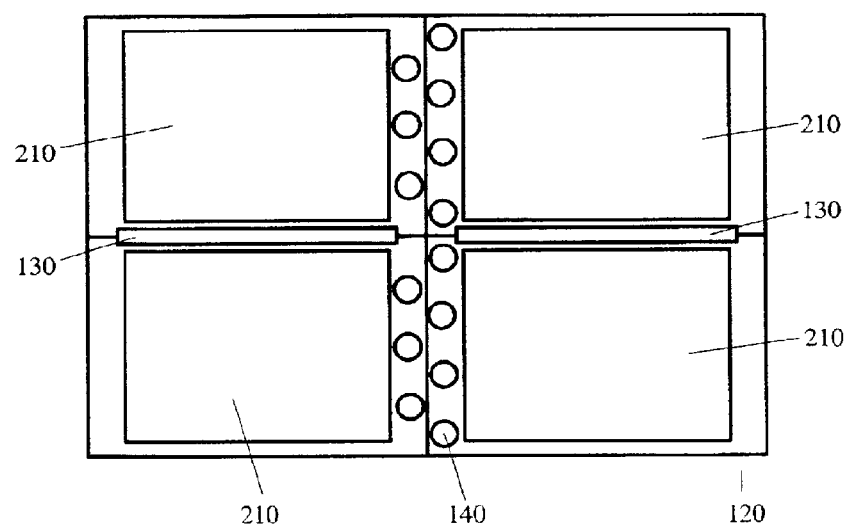
FIG. 3  300
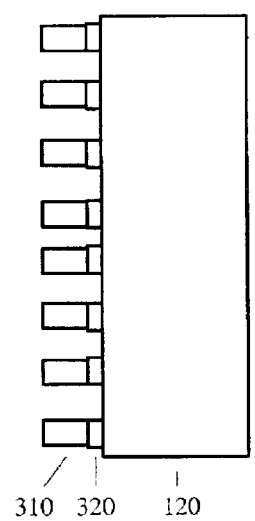
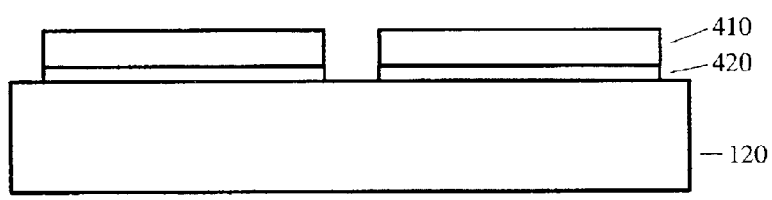
FIG. 4  400

US 6,940,636 B2

OPTICAL SWITCHING APPARATUS AND METHOD OF ASSEMBLING SAME

FIELD OF THE INVENTION

The present invention relates generally to optical networking, and more particularly to an optical networking apparatus and a method for assembling same.

BACKGROUND OF THE INVENTION

Micro Electro-Mechanical Systems (MEMS) for use in optical switching applications typically contain optical mirrors that are controllable electronically. The optical mirrors are typically micro-machined from a silicon wafer and coated with various materials to produce a reflective mirror surface. The mirror structure is typically bonded onto a substrate, and the resulting structure is typically packaged within a glass-covered package. The glass allows light to pass to and from the optical mirrors.

The substrate typically includes electrode pads that are used to control the position of the optical mirrors, and also includes various electrical contacts. When the mirror structure is bonded onto the substrate, the electrical contacts on the substrate need to make contact with electrical contacts on the mirror structure, and the optical mirrors must be positioned a precise distance above the electrode pads. This is because the voltage required to position a mirror depends on the distance of the mirror from the electrode pads, and variations in the distance between the mirrors and the electrode pads make it difficult to control the position of the mirrors.

SUMMARY OF THE INVENTION

In accordance with one aspect of the invention, the gap between the mirror structure and the substrate of an optical switching apparatus is controlled by mechanical standoffs placed between the mirror structure and the substrate. The mechanical standoffs are typically deposited onto the substrate and formed to a very precise thickness. The mirror structure is bonded to the substrate using solder, which typically also forms the electrical connections between the substrate and the mirror structure. For convenience, the solder used for bonding the mirror structure to the substrate and for making the electrical connections is referred to hereinafter as the bonding solder. The mechanical standoffs are made from a material that has a higher melting point (MP) than the bonding solder. The mirror structure is bonded to the substrate under pressure at a temperature between the bonding solder MP and the mechanical standoff MP. Thus, the bonding solder melts to form the appropriate mechanical and electrical bonds, but the mechanical standoffs do not melt and therefore maintain a precise gap between the mirror structure and the substrate.

In accordance with another aspect of the invention, a method for assembling an optical networking device having a mirror structure bonded to a substrate involves forming a number of mechanical standoffs between the mirror structure and the substrate from a first material, forming a number of electrical contacts between the mirror structure and the substrate from a second solder material having a lower melting point than the first material, and bonding the mirror structure to the substrate under pressure at a temperature between the melting point of the first material and the melting point of the second solder material. The electrical contacts may be formed on the substrate and/or the mirror structure, which typically involves depositing a solderable surface and depositing the first solder material onto the solderable surface. Likewise, the mechanical standoffs may be formed on the substrate and/or the mirror structure, which typically involves either depositing the second material to a predetermined mechanical standoff thickness or depositing the second material to a thickness greater than a predetermined mechanical standoff thickness and removing some of the deposited second material to obtain the predetermined mechanical standoff thickness. The second material is typically either a solder material having a higher melting point than the second solder material, a metallic material having a higher melting point than the second solder material, or a glass material having a higher melting point than the second solder material. The number of electrical contacts are typically formed to a thickness greater than that of the mechanical standoffs so that the number of electrical contacts are compressed during said bonding.

In accordance with yet another aspect of the invention, an apparatus includes a number of mechanical standoffs formed from a first material for physically separating the mirror structure from the substrate by a predetermined distance and a number of electrical contacts formed from a second solder material having a lower melting point than the first material for bonding a mirror structure to a substrate. The first material is typically either a solder material having a higher melting point than the second solder material, a metallic material having a higher melting point than the second solder material, or a glass material having a higher melting point than the second solder material. The apparatus may be either the substrate or the mirror structure.

In accordance with still another aspect of the invention, an optical switching apparatus includes a mirror structure bonded to a substrate through the process of forming a number of mechanical standoffs between the mirror structure and the substrate from a first material, forming a number of electrical contacts between the mirror structure and the substrate from a second solder material having a lower melting point than the first material, and bonding the mirror structure to the substrate under pressure at a temperature between the melting point of the first material and the melting point of the second solder material. The electrical contacts may be formed on the substrate and/or the mirror structure through the process of depositing a solderable surface and depositing the second solder material onto the solderable surface. Likewise, the mechanical standoffs may be formed on the substrate and/or the mirror structure through the process of depositing the first material to a predetermined mechanical standoff thickness or depositing the first material to a thickness greater than a predetermined mechanical standoff thickness and removing some of the deposited first material to obtain the predetermined mechanical standoff thickness. The first material is typically either a solder material having a higher melting point than the second solder material, a metallic material having a higher melting point than the second solder material, or a glass material having a higher melting point than the second solder material. The number of electrical contacts are typically formed to a thickness greater than that of the mechanical standoffs so that the number of electrical contacts are compressed during said bonding.

BRIEF DESCRIPTION OF THE DRAWINGS

In the accompanying drawings:

FIG. 2 shows an exemplary substrate assembly including electrical contacts formed from a first solder material and mechanical standoffs formed from a second solder material having a higher melting point than that of the first solder material in accordance with an embodiment of the present invention;

FIG. 3 shows a cross-sectional view of the substrate assembly along the plane of the electrical contacts in accordance with an embodiment of the present invention;

FIG. 4 shows a cross-sectional view of the substrate assembly along with plane of the mechanical standoffs in accordance with an embodiment of the present invention.

DETAILED DESCRIPTION OF A PREFERRED EMBODIMENT

In an embodiment of the present invention, the gap between the mirror structure and the substrate is controlled by mechanical standoffs placed between the mirror structure and the substrate. The mechanical standoffs are typically deposited onto the substrate and formed to a very precise thickness. The mirror structure is bonded to the substrate using solder, which typically also forms the electrical connections between the substrate and the mirror structure. For convenience, the solder used for bonding the mirror structure to the substrate and for making the electrical connections is referred to hereinafter as the bonding solder. The mechanical standoffs are made from a material that has a higher melting point (MP) than the bonding solder. The mirror structure is bonded to the substrate under pressure at a temperature between the bonding solder MP and the mechanical standoff MP. Thus, the bonding solder melts to form the appropriate mechanical and electrical bonds, but the mechanical standoffs do not melt and therefore maintain a precise gap between the mirror structure and the substrate.

Figure 1:
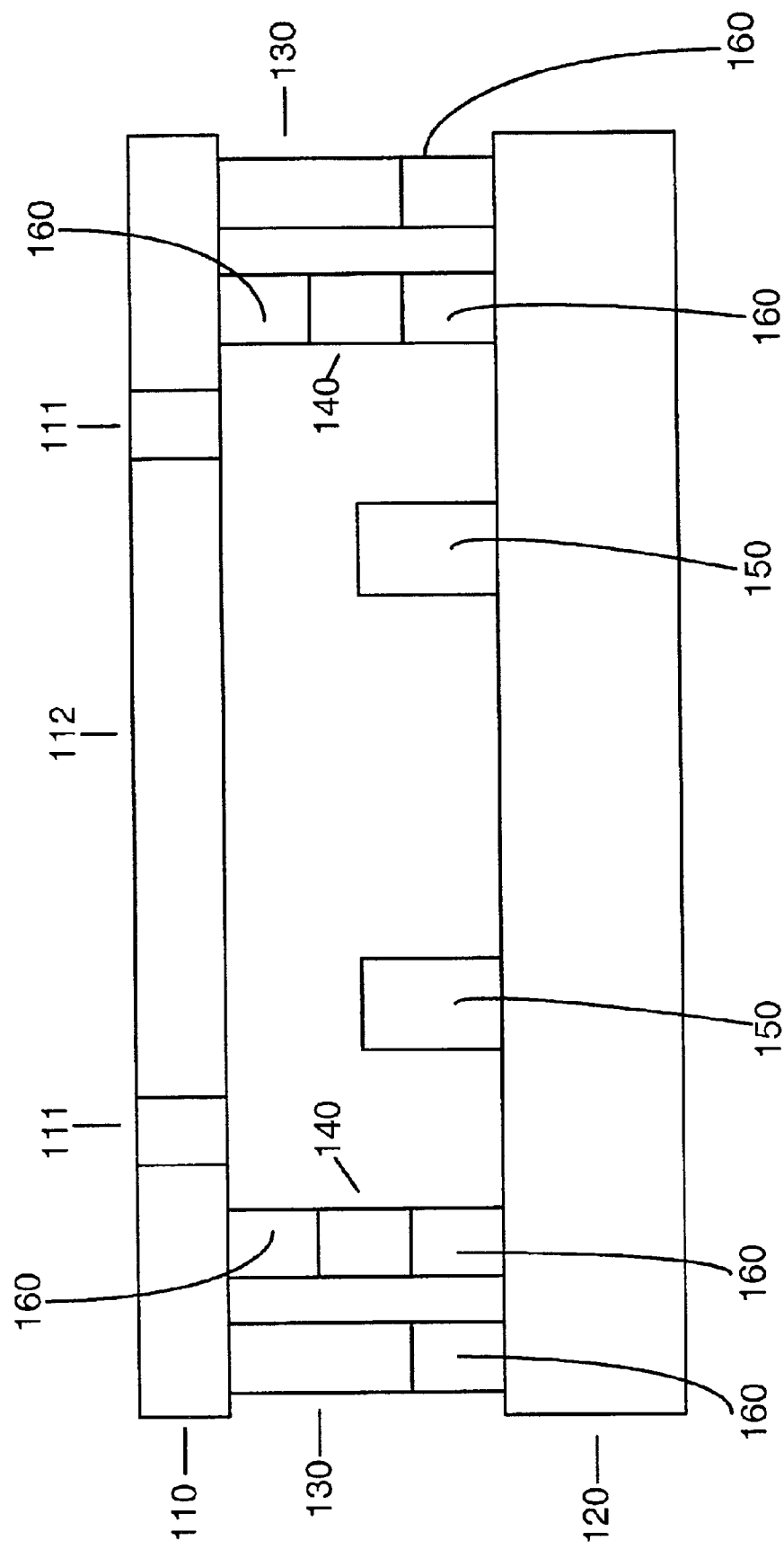
FIG. 1 shows an exemplary optical mirror assembly including a mirror structure bonded to a substrate in accordance with a process of the present invention.

FIG. 1 shows an exemplary optical mirror assembly 100. Among other things, the optical mirror assembly 100 includes a mirror structure 110, a substrate 120, mechanical standoffs 130, electrical contacts 140, and electrode pads 150.

The mirror structure 110 is typically micro-machined from a single piece of silicon or a single silicon-on-insulator substrate to produce an optical mirror 112 that is movably suspended via tethers 111.

The electrical contacts 140 can be formed from any of a variety of solder materials, such as 63Sn-37Pb and 42Sn-588Bi. The electrical contacts 140 can be formed using any of a variety of techniques, including, but not limited to, screen printing techniques, stenciling techniques, and various placement techniques (e.g., placing individual solder balls). The electrical contacts 140 are typically deposited to a thickness greater than that of the mechanical standoffs 130, and are compressed during the bonding process when the mirror structure 110 is pressed onto the substrate 120. A solderable surface 160 is typically deposited onto both the mirror structure 110 and the substrate 120 so that the electrical contacts 140 adhere to both. Examples of solderable surfaces for both the mirror side and the substrate side include aluminum with a nickel gold solderability treatment, pure gold, and pure platinum. In addition, the substrate 120 could have a copper with nickel and gold solderability coating, thick film gold, or thick film nickel with a solderability coating. It should be noted that the present invention is in no way limited to any particular solder or solderable surface material or to any particular technique for forming the electrical contacts 140.

The mechanical standoffs 130 can be formed from any of a variety of materials having a higher MP than the bonding solder.

In one exemplary embodiment, the mechanical standoffs 130 are formed from solder having a higher MP than the bonding solder, such as 95Pb-5Sn, which melts at 305 C, and 95Pb-25In, which melts at 275 C. In such an embodiment, a solderable surface 160 is typically deposited onto the substrate 120, and the mechanical standoff solder is deposited on top of the solderable surface. The solder mechanical standoffs 130 can deposited using any of a variety of techniques, such as screen printing techniques, stenciling techniques, placement techniques, and placement of solder balls and solder preforms.

In another exemplary embodiment of the present invention, the mechanical standoffs 130 are formed from a metallic material (e.g., nickel) having a higher MP than the bonding solder. The metallic material can be deposited onto the substrate 120 with or without an adhesive layer, for example, using various electroplating techniques.

In yet another embodiment of the present invention, the mechanical standoffs 130 are formed from glass having a higher MP than the bonding solder. A glass frit material is typically used to produce the glass standoffs. The glass frit material is essentially a paste that includes a glass powder suspended in an organic binder. The glass frit material is typically deposited onto the substrate 120 using a screen printing technique. The organic compounds of the glass frit material are then burned off at a particular temperature, and the remaining glass powder is fired at a higher temperature in order to glaze the glass.

It should be noted that the present invention is in no way limited to any particular mechanical standoff material or to any particular technique for forming the mechanical standoffs 130, so long as the mechanical standoff material has a higher melting point than the bonding solder.

The mechanical standoffs 130 can be formed to the desired thickness using any of a variety of techniques. Typically, the mechanical standoffs 130 are deposited to a predetermined thickness that is within a predetermined tolerances. If the mechanical standoff material cannot be deposited to the desired thickness, then the mechanical standoffs can be built up layer by layer until the desired mechanical standoff thickness is reached, or the mechanical standoffs can be deposited to a thickness greater than the desired thickness and the excess material can be removed (e.g., by grinding or lapping) to obtain the desired thickness. It should be noted that the present invention is in no way limited to any particular technique for forming the mechanical standoffs to the desired thickness within the predetermined tolerances.

It should be noted that, wherever solder is used (i.e., for the electrical contacts 140 and possibly for the mechanical standoffs 130), the solder is typically deposited onto top of a solderable metallization layer. For depositing solder onto a silicon substrate, the solderable metallization layer may be formed from layers of aluminum, nickel, and gold.

FIG. 2 shows an exemplary substrate assembly 200 including the substrate 120 on which the electrical contacts 140, the mechanical standoffs 130, and a number of electrodes 210 are formed. In this example, both the electrical contacts 140 and the mechanical standoffs 130 are formed from a solder material, with the solder material for the mechanical standoffs 130 having a higher MP than the solder material for the electrical contacts 140. The electrode pads 150 (not shown) are formed on the electrodes 210.

FIG. 3 shows a cross-sectional view 300 of the substrate assembly 200 along the plane of the electrical contacts 140. For each electrical contact 140, a solderable metallization layer 320 is typically formed on top of the substrate 120, and the bonding solder 310 is deposited on top of the solderable metallization layer 320.

FIG. 4 shows a cross-sectional view 400 of the substrate assembly 200 along the plane of the mechanical standoffs 130. For each mechanical standoff 130, a solderable metallization layer 420 is typically formed on top of the substrate 120, and the mechanical standoff material 410 is deposited on top of the solderable metallization layer 420.

In a typical embodiment of the present invention, the mechanical standoffs are formed from a solder material having a higher MP than the bonding solder. The mechanical standoff solder is typically deposited before the bonding solder.

In order to form the mechanical standoffs, the mechanical standoff solder is deposited onto the substrate. The mechanical standoff solder is reflowed by heating it to a temperature above its melting point. During the reflow, the mechanical standoff solder melts and any flux and solvents evaporate or burn off. The mechanical standoff solder is typically formed to at least the desired thickness of the mechanical standoff, but may be deposited to a greater thickness and then lapped to the correct thickness.

Once the mechanical standoffs are formed, the electrical contacts are formed. In order to form the electrical contacts, solder balls are stencil printed or placed onto the substrate. The stencil for this operation is typically fabricated with cavities etched into the underside so as to accommodate the mechanical standoffs. The bonding solder is reflowed by heating it to a temperature above its melting point but below the melting point of the mechanical standoff solder. During the reflow, the bonding solder melts and any flux and solvents evaporate or burn off, but the mechanical standoff solder does not melt. The bonding solder is typically formed to a thickness exceeding that of the mechanical standoffs. This helps to ensure that the bond pads on the mirror structure make contact with the electrical contacts during the bonding operation.

Once the mechanical standoffs and electrical contacts are in place, the mirror structure is bonded to the substrate under pressure at a temperature between the bonding solder and the mechanical standoff solder. This allows the bonding solder to melt and form the mechanical and electrical bonds without destroying the mechanical standoffs.

Figure 5:
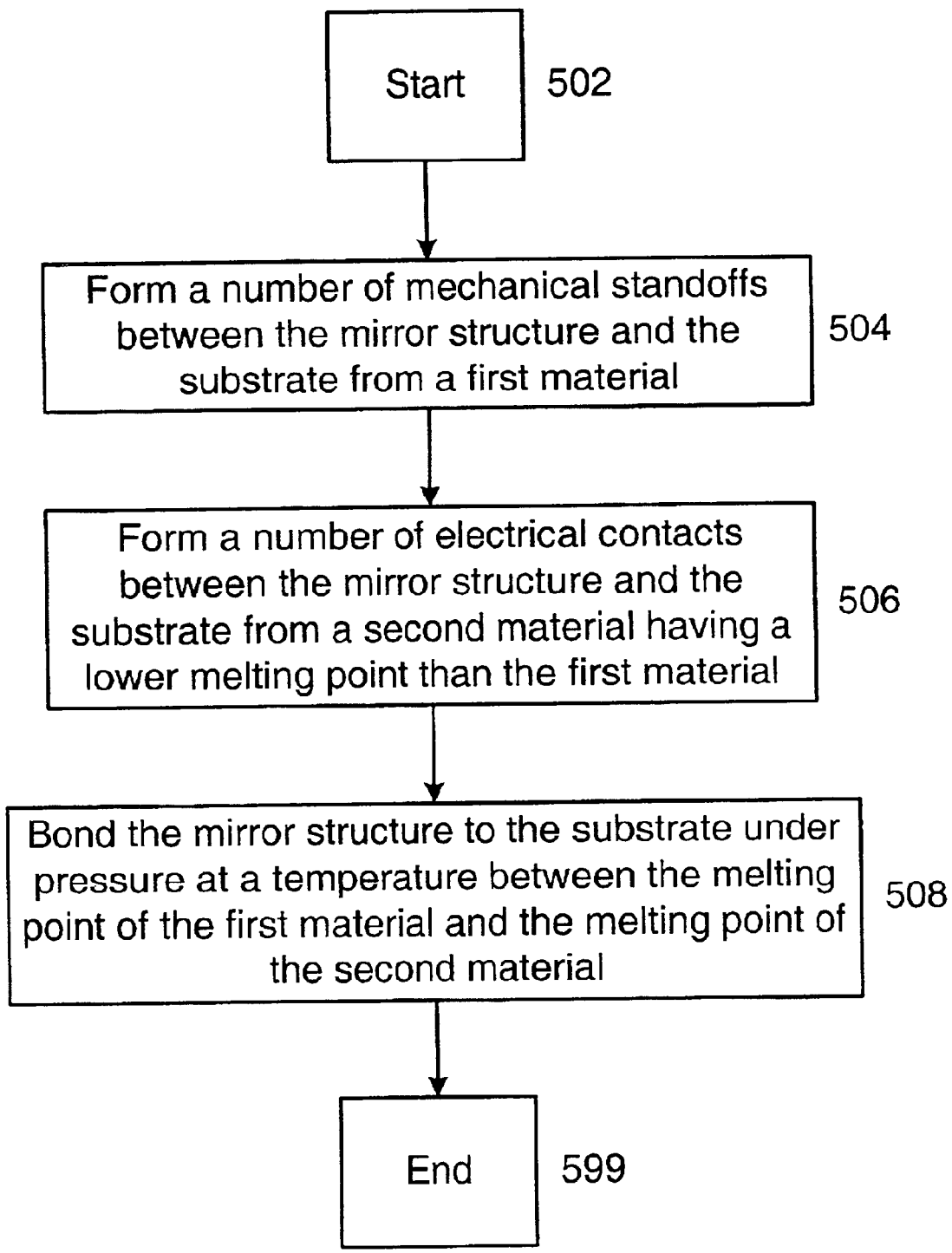
FIG. 5 is a flow diagram describing a process for assembling an optical switching device in accordance with an embodiment of the present invention.

FIG. 5 is a flow diagram describing a process 500 for assembling an optical switching device. Beginning at block 502, a number of mechanical standoffs are formed between the mirror structure and the substrate from a first material, in block 504. A number of electrical contacts are formed between the mirror structure and the substrate from a second solder material having a lower melting point than the first material, in block 506. The mirror structure is bonded to the substrate under pressure at a temperature between the melting point of the first material and the melting point of the second solder material, in block 508. The process 500 terminates in block 599.

It should be noted that there is no requirement that the mechanical standoffs be deposited prior to the bonding solder, and the present invention is in no way limited to depositing the mechanical standoffs prior to the bonding solder. In many cases, the mechanical standoffs can be deposited without having to be heated above the melting point of the bonding solder, and therefore the mechanical standoffs may be deposited after the bonding solder without damaging the bonding solder.

Although the above embodiments describe electronic contacts 140 and mechanical standoffs 130 formed onto the substrate 120, it should be noted that the electronic contacts 140 and/or the mechanical standoffs 130 could be formed onto the mirror structure 110.

It should be noted that, once the mirror structure 110 is bonded to the substrate, the assembly should be kept at temperatures below the bonding solder MP. Specifically, packaging processes should not use temperatures exceeding the bonding solder MP. Thus, for example, the assembly could be hermetically sealed into its packaging at a temperature below the bonding solder MP (i.e., step soldering), or the assembly could be sealed into its packaging using a seam sealing technique that uses localized heat for welding. It should be noted that the present invention is in no way limited to any particular packaging form or technique.

It should be noted that the described techniques for bonding a mirror structure to a substrate can be used generally for bonding a mirror array to an electrode array. The mirror array and/or the electrode array may be integrated with electronics.

The present invention may be embodied in other specific forms without departing from the true scope of the invention. The described embodiments are to be considered in all respects only as illustrative and not restrictive.

What is claimed is:

1. A method for assembling an optical networking device, the optical networking device comprising a mirror structure bonded to a substrate, the method comprising:

forming a number of mechanical standoffs on at least one of the mirror structure and the substrate by depositing a first material to a thickness at least equal to a predetermined mechanical standoff thickness; and forming a number of electrical contacts between the mirror structure and the substrate from a second solder material having a lower melting point than the first material; and bonding the mirror structure to the substrate under pressure at a temperature between the melting point of the first material and the melting point of the second solder material so that the second solder material melts to form mechanical and electrical bonds.

2. The method of claim 1, wherein forming the number of electrical contacts comprises forming the number of electrical contacts on one of the substrate and the mirror structure.

3. The method of claim 2, wherein forming the number of electrical contacts on one of the substrate and the mirror structure comprises:

depositing a solderable surface; and depositing the second solder material onto the solderable surface.

4. The method of claim 1, wherein forming the number of mechanical standoffs on one of the substrate and the mirror structure comprises:

depositing the first material to a thickness greater than a predetermined mechanical standoff thickness; and removing some of the deposited first material to obtain the predetermined mechanical standoff thickness.

5. The method of claim 1, wherein the first material comprises one of:
- a solder material having a higher melting point than the second solder material;
- a metallic material having a higher melting point than the second solder material; and
- a glass material having a higher melting point than the second solder material.

6. The method of claim 1, wherein the number of electrical contacts are formed to a thickness greater than that of the mechanical standoffs, and wherein the number of electrical contacts are compressed during said bonding.

7. An apparatus comprising:
- a mirror structure;
- a substrate;
- a number of mechanical standoffs formed from a first material deposited to a thickness it least equal to a predetermined mechanical standoff thickness on at least one of the mirror structure and the substrate for physically separating the mirror structure from the substrate by a predetermined distance; and
- a number of electrical contacts formed from a second solder material having a lower melting point than the first material, wherein the mirror structure is bonded to the substrate under pressure at a temperature between the melting point of the first material and the melting point of the second solder material so that the second solder material melts to form mechanical and electrical bonds.

8. The apparatus of claim 7, wherein the first material comprises one of:
- a solder material having a higher melting point than the second solder material;
- a metallic material having a higher melting point than the second solder material; and
- a glass material having a higher melting point than the second solder material.

9. The apparatus of claim 7, wherein the electrical contacts are formed onto one of the mirror structure and the substrate.

10. An optical switching apparatus comprising a mirror structure bonded to a substrate through the process of:
- forming a number of mechanical standoffs on at least one of the mirror structure and the substrate from a first material deposited to a thickness at least equal to a predetermined mechanical standoff thickness; and
- forming a number of electrical contacts between the mirror structure and the substrate from a second solder material having a lower melting point than the first material; and
- bonding the mirror structure to the substrate under pressure at a temperature between the melting point of the first solder material and the melting point of the second material so that the second solder material melts to form mechanical and electrical bonds.

11. The optical switching apparatus of claim 10, wherein the number of electrical contacts are formed on one of the substrate and the mirror structure.

12. The optical switching apparatus of claim 11, wherein the number of electrical contacts are formed on one of the substrate and the mirror structure through the process of:
- depositing a solderable surface; and
- depositing the second solder material onto the solderable surface.

13. The optical switching apparatus of claim 10, wherein the number of mechanical standoffs are formed on one of the substrate and the mirror structure through the process of:
- depositing the first material to a thickness greater than a predetermined mechanical standoff thickness; and
- removing some of the deposited first material to obtain the predetermined mechanical standoff thickness.

14. The optical switching apparatus of claim 10, wherein the first material comprises one of:
- a solder material having a higher melting point than the second solder material;
- a metallic material having a higher melting point than the second solder material; and
- a glass material having a higher melting point than the second solder material.

15. The optical switching apparatus of claim 10, wherein the number of electrical contacts are formed to a thickness greater than that of the mechanical standoffs, and wherein the number of electrical contacts are compressed during said bonding.

* * * * *

UNITED STATES PATENT AND TRADEMARK OFFICE
CERTIFICATE OF CORRECTION

PATENT NO.     : 6,940,636 B2
DATED          : September 6, 2005
INVENTOR(S)    : Lawrence E. Felton It is certified that error appears in the above-identified patent and that said Letters Patent is hereby corrected as shown below:

Title page,
Item [54], Title, replace "OPTICAL SWITCHING APPARATUS AND METHOD OF ASSEMBLING SAME" with -- OPTICAL SWITCHING APPARATUS AND METHOD FOR ASSEMBLING SAME --.

Column 7,
Line 18, replace "it" with -- at --.

Signed and Sealed this

Eighth Day of November, 2005

JON W. DUDAS
*Director of the United States Patent and Trademark Office*